United States Patent
Takahashi et al.

(10) Patent No.: US 6,884,936 B2
(45) Date of Patent: Apr. 26, 2005

(54) ELECTROMAGNETIC SHIELD FILM, ELECTROMAGNETIC SHIELD UNIT AND DISPLAY

(75) Inventors: Hiroaki Takahashi, Utsunomiya (JP); Junichi Imaizumi, Shimodate (JP); Hajime Nakamura, Yuki (JP); Hiroshi Nomura, Oyama (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/468,143

(22) PCT Filed: Feb. 25, 2002

(86) PCT No.: PCT/JP02/01655

§ 371 (c)(1), (2), (4) Date: Aug. 25, 2003

(87) PCT Pub. No.: WO02/071824

PCT Pub. Date: Sep. 12, 2002

(65) Prior Publication Data

US 2004/0074655 A1 Apr. 22, 2004

(30) Foreign Application Priority Data

Mar. 2, 2001 (JP) ........................................ 2001-057979

(51) Int. Cl.[7] .............................................. H05K 9/00
(52) U.S. Cl. ............................... 174/35 R; 174/35 MS; 348/819
(58) Field of Search .................... 174/35 R, 35 GC, 174/35 MS; 361/816, 818; 348/819; 428/209, 349, 457, 488

(56) References Cited

U.S. PATENT DOCUMENTS

| | | | | |
|---|---|---|---|---|
| 4,412,255 A | * | 10/1983 | Kuhlman et al. | 348/819 |
| 4,958,148 A | * | 9/1990 | Olson | 345/174 |
| 6,086,979 A | * | 7/2000 | Kanbara et al. | 428/209 |
| 6,150,754 A | * | 11/2000 | Yoshikawa et al. | 313/313 |
| 6,353,501 B1 | * | 3/2002 | Woodruff et al. | 359/585 |
| 6,417,619 B1 | * | 7/2002 | Yasunori et al. | 313/582 |

FOREIGN PATENT DOCUMENTS

| | | |
|---|---|---|
| JP | 3-145008 | 6/1991 |
| JP | 10-41682 | 2/1998 |
| JP | 2000-36687 | 2/2000 |
| JP | 2000-183585 | 6/2000 |

OTHER PUBLICATIONS

English Language Abstract of JP 3-145008.
English Language Abstract of JP 10-41682.
English Language Abstract of JP 2000-36687.
English Language Abstract of JP 2000-183585.

* cited by examiner

Primary Examiner—Dean A. Reichard
Assistant Examiner—Carmelo Oliva
(74) Attorney, Agent, or Firm—Greenblum & Bernstein, P.L.C.

(57) ABSTRACT

An electromagnetic wave shield film (1) comprises a transparent base (2), a conductor (4) positioned on the transparent base (2) via an adhesive (3) and having a mesh geometric pattern, and an earth portion (5) arranged around the conductor (4) and including conductive regions (501) which absorb electromagnetic waves, and non-conductive regions (510) which prevent the earth portion (5) from being creased.

19 Claims, 11 Drawing Sheets

Fig. 22

| SAMPLE | Electromagnetic Wave Shielding Performance [dB] | Visible Light Transmission Factor [%] | Creases | | Aerial Ratio of Conductive Region [%] |
|---|---|---|---|---|---|
| | | | Pitch | Height | |
| First Example | 51 | 72 | 10.2cm | 2 mm | 69.4 |
| Second Example | 54 | 72 | 9.4cm | 3 mm | 95.2 |
| Third Example | 56 | 71 | 8.8cm | 7 mm | 96.0 |
| First Comparison Example | 56 | 71 | 4.7cm | 18 mm | 100 |
| Second Comparison Example | 48 | 72 | 11.6cm | 2 mm | 19.0 |

ELECTROMAGNETIC SHIELD FILM, ELECTROMAGNETIC SHIELD UNIT AND DISPLAY

TECHNICAL FIELD

The present invention relates to an electromagnetic wave shield film, an electromagnetic wave shield unit and a display, and more particularly relates not only to an electromagnetic wave shield film which shields electromagnetic waves generated via a front part of a plasma display including a plasma display panel (PDP), a cathode ray tube (CRT) display, a liquid crystal display (LC), an electro luminescence display (EL) or the like, but also to an electromagnetic wave shield unit including the electromagnetic wave shield film and a display including the electromagnetic wave shield unit.

BACKGROUND ART

Recently, computerization has been remarkably promoted and improved. Displays are one of essential items for the computerization, and are being used for a variety of devices such as television sets (TV), word processors, personal computers, analyzers, game machines, and vehicle-mounted monitors. Further, such displays have been extensively enlarged.

Electromagnetic waves radiated from electric and electronic devices have become one of serious social problems. Such electromagnetic waves tend to reach adjacent devices as noise or erroneously operate them. As more electric and electronic devices are used and computers are used to control such electric and electronic devices, electromagnetic wave-related problems increase and inevitably become more serious and unpredictable. Further, it is pointed out that electromagnetic waves result in health hazard. There have been controls on such problems in Europe and the United States of America. In Japan, manufacturers' organizations exercise voluntary restriction against hazards caused by electromagnetic waves.

Generally, the following measures have been taken in order to shield electromagnetic waves, e.g. cabinets or containers are made of metals or highly conductive material or metal plates are inserted between circuit boards, and cables are covered by metal foil.

However, the foregoing measures tend to adversely affect the most important feature, i.e. visibility of images on the display. In other words, shield films should not have the ability to shield electromagnetic waves but also be transparent in order to assure the image visibility.

Japanese Patent Laid-Open Publication No. Hei 10-041,682 describes an electromagnetic wave shield film filter in order to overcome the foregoing problems. In the electromagnetic film shield filter, a transparent plastic film and a conductor such as copper foil are bonded using an adhesive, if necessary, and a geometric pattern is chemically etched on the conductor. The electromagnetic wave shield filter reflects and absorbs electromagnetic waves from a display (i.e. a device) via the conductor.

Most of the electromagnetic waves from the display are reflected by the conductor while non-reflected electromagnetic waves are absorbed as electric energy and removed via an earth portion surrounding the electromagnetic wave shield filter. Generally, the earth portion is in the shape of a strip, is approximately 5 mm to 15 mm wide, and makes the conductor and a display cabinet conductive.

The electromagnetic wave shield filter is laminated with a glass plate, a plastic plate or the like, as the transparent base (e.g. a transparent plastic film) of the filter being contact with the plates or the like, and forms a front plate of the display. The front plate is integral with a cabinet in which the display body is housed. Alternatively, the electromagnetic wave shield filter may be integral with the display cabinet, or may be attached to the display body. The earth portion of the electromagnetic wave shield filter is bonded to the earth portion of the display.

The following problems seem to be present in the foregoing electromagnetic wave shield filter.

The electromagnetic wave shield filter comprises the conductor and the earth portion mounted on the transparent base as described above. The conductor and the earth portion are made of conductive materials such as metal foil while the transparent base is made of plastics, glass or the like. The transparent base and conductive materials have different coefficients of thermal expansion or deformation, which would crease the earth portion where the transparent base and the conductor of the shape of a strip overlap.

In the foregoing case, it is very difficult to smoothly and uniformly bond the conductor and the earth portion on the transparent base. Air bubbles are sometimes present between the transparent base and the conductor and between the transparent base and the earth portion, which causes non-uniform or insufficient bonding. To overcome this problem, it is conceivable to use a very strong adhesive, which might put a limit on productivity or adversely affect mass productivity. Further, if the electromagnetic wave shield filter is directly integrated to a display cabinet or to a display body, it is also very difficult to bond the transparent base and conductive members smoothly and reliably. Air bubbles may be present between the transparent base and the conductive members, which will cause partial contact or bonding thereof. Some measures should be taken in order to overcome the foregoing problems, which would adversely affect the mass productivity.

Insufficient bonding between the earth portion and the display cabinet or the display would prevent them from being electrically and reliably connected. This will reduce electromagnetic wave shielding performance and damage the display body.

DISCLOSURE OF INVENTION

The invention has been contemplated in order to overcome the foregoing problems of the related art. An object of the invention is to provide an electromagnetic wave shield film in which the earth portion remains flat without any creases.

A further object of the invention is to provide an electromagnetic wave shield unit which includes the foregoing electromagnetic wave shield film, and is suitable to mass production.

A final object of the invention is to provide a display which includes the electromagnetic wave shield unit and is suitable to mass production.

According to a first feature of the invention, there is provided an electromagnetic wave shield film comprising: a transparent base; a conductor mounted on the transparent base and having a geometric pattern; and an earth portion arranged around the conductor and having conductive regions and non-conductive regions. The term "conductive region" refers to a region which is electrically connected to a display cabinet, and absorbs electromagnetic waves at least as electric energy in order to remove them. Further, the term "non-conductive region" refers to a region which is free from any conductor in order to prevent the earth portion from being creased due to a difference between coefficients of thermal expansion of the transparent base and the conductive region. Alternatively, the non-conductive region may be made by partially removing the conductor from the earth portion. Accordingly, the earth portion may be called the "partially conductive region".

The non-conductive region enables the conductive region to freely expand and contract, and prevent the earth portion from being creased.

In accordance with a second feature of the invention, the conductive regions occupy 30% to 99% of the earth portion, which means that the non-conductive regions occupy 1% to 70% of the earth portion.

When the conductive region occupies 30% to 99% of the earth portion, it is possible to improve the electromagnetic wave shielding performance, and to prevent the earth portion from being creased. Further, the conductive regions may occupy 60% to 99% of the earth portion in order to further improve the electromagnetic wave shielding performance by increasing a contact area between the display cabinet or display body and the earth portion. Still further, the conductive regions may occupy 65% to 97% of the earth portion in order to improve the electromagnetic wave shielding performance and to prevent the creasing of the earth portion.

It is preferable that the earth portion creases at a 70 mm interval or more and has 10 mm crease height or less. This is effective in suppressing air bubbles or poor connections which may be caused when an electromagnetic wave shield film is bonded to a glass plate, a plastic plate or the like (i.e. when the electromagnetic wave shield unit or a front plate is being made). Further, the 70 mm crease interval or more and the 10 mm crease height or less are preferable to prevent air bubbles and poor connections when the electromagnetic wave shield film or a front plate is bonded to the display cabinet or display body. Therefore, the earth portion of the electromagnetic wave shield film is reliably contacted to an earth portion of the front plate, display cabinet or display body, which assures the target electromagnetic wave shielding performance.

The ratio of the conductive region to the earth portion is appropriately determined in order to maximize the electromagnetic wave shielding performance and minimize creases of the earth portion.

According to a third feature of the invention, the conductive region of the earth portion has at least one of the following geometric patterns:
(1) a rectangular geometric pattern;
(2) a comb-shaped pattern;
(3) a zigzag pattern;
(4) a parallelogram pattern;
(5) a ladder-shaped pattern;
(6) a mesh geometrical pattern;
(7) a triangular pattern;
(8) a pentagonal or polygonal pattern;
(9) a circular or oval pattern; and
(10) a pentacle pattern.

It is preferable that a line width of the mesh geometric pattern of the conductive region of the earth portion is larger than that of the geometric pattern of the conductor in order to improve the electromagnetic wave shielding performance. In other words, the conductor has to have a sufficient aperture ratio in order to assure good visibility and improve the electromagnetic wave shielding performance. The aperture ratio is preferably 50% to 98% of the conductor, for example.

This feature enables the electromagnetic wave shield film to effectively shield electromagnetic waves by simply changing surface patterns on the conductive and/or non-conductive regions of the earth portion. This is effective improving the electromagnetic wave shielding performance and reducing creases on the earth portion.

In accordance with a fourth feature of the invention, the conductor having the mesh geometric pattern and the conductive region of the foregoing electromagnetic wave shield film are bonded using an adhesive.

The foregoing electromagnetic wave shield films can be easily produced by bonding the metal foil or the like to the transparent base.

According to a fifth feature of the invention, there is provided an electromagnetic wave shield unit which comprises one of the foregoing electromagnetic wave shield films, and a protective film on the shield film. Specifically, the term "electromagnetic wave shield unit" refers to a component which is easily attachable to a display cabinet or a display body. For instance, the term also refers to a front plate or a component which is a part of a front plate.

This electromagnetic wave shield unit can effectively shield electromagnetic waves similarly to the foregoing electromagnetic wave shield films.

According to a sixth feature, there is provided an electromagnetic wave shield unit comprising one of the foregoing electromagnetic wave shield films, and a protective film on the shield film. The definition of the electromagnetic wave shield unit is the same as that of the fifth feature.

This electromagnetic wave shield unit can effectively shield electromagnetic waves similarly to the foregoing electromagnetic wave shield films.

In accordance with a seventh feature, there is provided a display including a display module and an electromagnetic wave shield unit, which is provided with at least: (1) any of the foregoing electromagnetic wave shield films attached onto the display module; and (2) a protective film at least on said conductor of the electromagnetic wave shield film. The term "display module" refers to at least a display cabinet or a display body. For instance, the display module may be a plasma display module, a CRT display module, an electroluminescent display or the like. In other words, the display cabinet or display body may be usable as the display module. Further, the electromagnetic wave shield unit of the sixth feature can be used in this case.

This display also includes an earth portion with the conductive and non-conductive regions and in which the conductive region can freely expand and contract. This is effective in preventing the earth portion from being creased, and in improving the electromagnetic wave shielding performance and promoting mass production.

BRIEF DESCRIPTION OF DRAWINGS

FIG. 22 is a graph showing measured results of electromagnetic wave shielding performance of the electromagnetic films of the embodiment of the invention and the electromagnetic film of the related art.

BEST MODE FOR CARRYING OUT THE INVENTION

Figure 1:
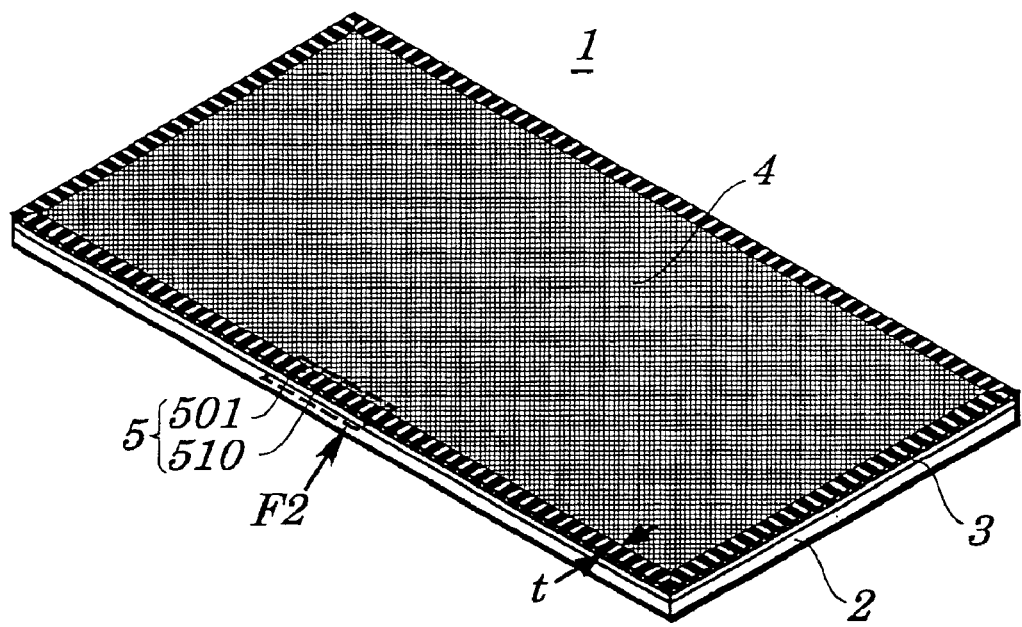
FIG. 1 is a perspective view of an electromagnetic wave shield film according to the embodiment of the invention.

The following describe electromagnetic wave shield films and methods of manufacturing the same with reference to examples shown in the drawings. Like or corresponding parts are denoted by like or corresponding reference numerals. The drawings are schematic, dimensions such as thickness and length of components may differ from those of the actual components. Further, different scales may be sometimes used.

[Basic Structure of Electromagnetic Wave Shield Film]

Referring to FIG. 1, an electromagnetic wave shield film 1 comprises a transparent base 2, a conductor 4 provided on the transparent base 2 and having a geometric pattern, and an earth portion 5. The earth portion 5 is positioned around the conductor 4, and includes conductive regions 501 and non-conductive regions 510. The transparent base 2 is bonded to the conductor 4 and the conductive regions 501 of the earth portion 5 using an adhesive 3. An appropriate kind of the adhesive 3 will be used.

The transparent base 2 is preferably a plastic film which is easy to handle, less expensive and resistant to chemicals used for a chemical etching process. Any plastic film will do so long as it is transparent. For instance, the following are usable: a polyethylene film, a polypropylene film, a polyester film, a polyvinyl chloride film, a poly-styrene film and so on. The foregoing films may be coated with surface lubricants such as silicone, polyvinyl alcohol, or alkyl carbamate or the like. Alternatively, the transparent base may be made of other materials.

The conductor 4 is preferably made of metal such as copper (Cu), aluminum (Al), nickel (Ni), iron (Fe), gold (Au), silver (Ag), tungsten (W), chrome (Cr) or titanium (Ti), or an alloy including two or more of the foregoing metals. For instance, stainless steel (Fe—Ni—Cr) or the like may be usable as an alloy. Further, the conductor 4 may be made of a conductive material such as conductive ink. It is most preferable that the conductor 4 is made of copper, aluminum or nickel, or an alloy of the foregoing metals in view of good conductivity, ease of making mesh geometrical patterns and low cost.

It is preferable that the conductor is 3 $\mu$m to 40 $\mu$m thick. The thinner the conductor 4, the larger the surface resistance. As a result, the conductor is difficult to sufficiently absorb electromagnetic waves, which tends to adversely affect the electromagnetic wave absorbing performance. On the other hand, if the conductor is too thick, it is very difficult to make the mesh geometric pattern with fine lines, which tends to reduce an angle of view.

As the adhesive 3 is preferably used an adhesive to be fluid at a certain temperature and to be cured at a temperature below the foregoing temperature. Specifically, the adhesive 4 inserted between the transparent base 2 and the conductor 4 should become fluid when heated and pressed, and is cured in order to easily bond the transparent base 2 and the conductor 4. Therefore, the adhesive 3 is preferably softened at 150° C. or lower in order to be treated with ease. Since the electromagnetic wave shield filter 1 is usually used at 80° C. or lower, the adhesive 3 is preferably softened at 80° C. to 120° C. in view of easy treatment. Alternatively, other kinds of adhesives may be usable.

The adhesive 3 is preferably made of a thermoplastic resin, a resin which is cured by active energy rays, or a thermosetting resin, or an adhesive containing at least two of the foregoing materials. Prior to being cured, the active-energy-ray-cured adhesive or the thermosetting adhesive is required to demonstrate the performance which is identical to that of the adhesive containing the thermoplastic resin.

The following are typical thermoplastic resins which are usable as the adhesive 3:

(1) natural rubber;
(2) polyisoprene;
(3) diene polymer groups such as poly-1,2-butadiene, polyisobutyrene, polybutene, poly-2-heptyl-1,3-butadiene, poly-2-t-butyl-1,3-butadiene, poly-1 and 3-butadiene and so on;
(4) polyether groups such as polyoxyethylene, polyoxypropylene, polybinylethyl ether, polyvinylhexyl ether, polyvinylbutyl ether and so on;
(5) polyester groups such as polyvinyl acetate, polyvinyl propionate and so on;
(6) polyurethane, ethyl cellulose, polyvinyl chloride, polyacrylo-nitrile, polymethacrylate nitrile, polysulfone, polysulfide, phenoxy resin; and (7) poly (metha) acrylate acid ester group such as polyethyl acrylate, polybutyl acrylates, poly-2-ethylhexyl acrylates, poly-t-butyl acrylates, poly-3-ethoxy propylacrylates, polyoxycarbonyl tetra-methacrylates, polymethyl acrylates, polyisopropyl methacrylates, polydodecyl methacrylates, polyisopropyl metha acrylate, polytetradecile methacrylate, poly-n-propyl methacrylate, poly-3,3,5-trimethyl cyclohexyl methacrylate, polyethyl methacrylate, poly-2-nitro-2-methylpropyl methacrylate, poly-1,1-diethyl propyl methacrylate, polymethyl methacrylate and so on. Two or more of the foregoing acrylic polymers may be polymerized or blended, if necessary.

The thermoplastic resins have preferably weight average molecular weight of 500 or more. If the weight average molecular weight is 500 or less, the components of the adhesives have less cohesion aggression and fail to bond the objects reliably.

If necessary, additives such as diluents, plasticizers, antioxidants, fillers, coloring agents, ultraviolet absorbents and agglutinants may be added to the thermoplastic resin adhesives.

The activation energy rays may be ultraviolet rays, electronic rays and so on. The resins cured by the activation energy rays may be preferably made of base polymers such as acrylic resins, epoxy resins, polyester resins and urethane resins to which radical or cationoid polymerization functional groups are added. The radical polymerization functional groups are preferably an acrylic group (acryloyl group), methacrylate group (methacryloyl group), vinyl group, and aryl group, all of which have double carbon-carbon bond and assure quick reaction. The cationoid polymerization functional groups may be typical alicyclic epoxy groups such as epoxy groups (glycidyl ether group and glycidyl amine group), which assure quick reaction. The following may be preferably and actually usable: acrylic urethane, epoxy (metha) acrylate, epoxy denatured polybutadiene, epoxy denatured polyester, polybutadiene (metha) acrylate, acryl denatured polyester, and so on.

The following photosensitizers or photoinitiators may be added to the adhesive cured by ultraviolet rays and are made of popular materials such as: benzophenon; anthraquione; benzoin; sulfonium salt; diazonium salt; omium salt; and halonium salt. Further, thermoplastic resins on the market may be blended into to the foregoing materials.

Thermosetting adhesives made of the following materials are usable: natural rubber, isoprene rubber and chloroprene rubber; polyisobutylene, butyl rubber, halogenoid butyl rubber, acrylicnitoril-buthadiene rubber, estylene-butadiene rubber, polyisobutene, carboxyl rubber, neoprene, and polybudadiene. Usable cross linking agents are sulfur, anilinformaldehyde resin, urea formaldehyde resin, phenol formaldehyde resin, ligrin resin, xylene formaldehyde resin, xylene formaldehyde resin, melamine formaldehyde resin, epoxy resin, urea resin, aniline resin, melamine resin, phenol resin, formalin resin, metal oxide, metal chloride, oxime, alkyl phenol resin and so on. Some of these materials may be blended. General-purpose accelerators may be added to the thermosetting adhesive in order to promote the cross linking process.

The thermosetting adhesives which are available to cross linking reactions comprise a resin having a functional group such as carboxyl group, hydroxyl group, epoxy group, amino group, unsaturated hydrocarbon and so on; and a curing agent having a functional group such as epoxy group, hydroxyl group, amino group, amide group, carboxyl group, thiole group and so on; or curing agents such as metal chloride, isocyanate, acid anhydride, metal oxide, peroxide or the like. An additive such as a general-purpose catalyst may be used in order to promote the thermosetting action. Specifically, as a thermosetting adhesive, the following are usable: a curing acrylic resin composition; an unsaturated polyester resin composition; diallyl phthalate resin; an epoxy resin composition; a polyurethane resin composition; and so on.

The following copolymers of acrylic resin and other resin material are usable epoxy acrylates; urethane acrylates; polyether acrylates; polyester acrylates and so on. Urethane acrylates, epoxy acrylates and polyether acrylates are optimum in view of their contact performance. The following methacrylate oxide additives are preferably used as epoxyacrylate: 1,6-hexanediole diglycidyl ether; neopentyl glycol glycidyl ether; allyl alcohol diglycidyl ether; adipic acid diglycidyl ester; phthalic acid diglycidyl ester; polyethylene glycol diglycidyl ether; trimethylol propane triglycidyl ether; glycerine triglycidyl ether; pentaerythritol tetraglycidyl ether; and sorbitol tetra-glycidyl ether. Polymers such as epoxyacrylate which contains hydroxyl therein are effective in improving the contact performance of the adhesive. Two or more of the foregoing copolymer resins are used together.

Figure 2:
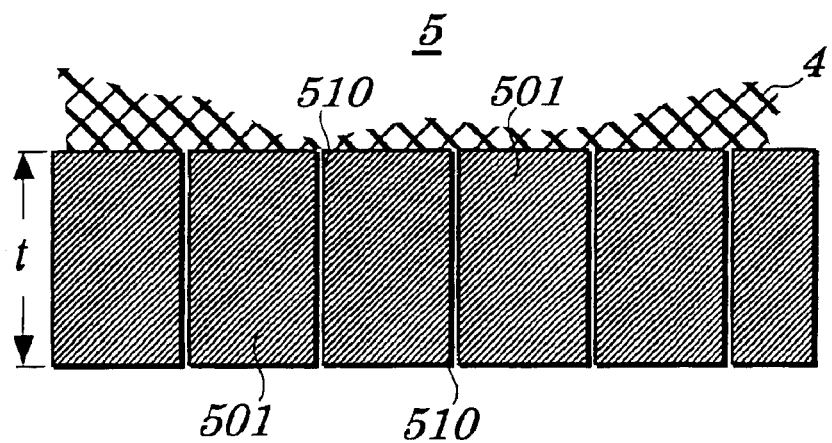
FIG. 2 is an enlarged plan view of an earth portion of the electromagntic wave shield film of FIG. 1.

Referring to FIG. 1, the earth portion 5 surrounds the periphery of the conductor 4, and includes the conductive regions 501 which are made of the material same as that of the conductor 4. In other words, the earth portion 5 is integral with the conductor 4. Alternatively, the conductive regions 501 and the conductor 4 may be made of different materials. Referring to FIG. 2 (the enlarged plan view of the earth portion at a point F2 in FIG. 1), the conductive regions 501 have a rectangular geometric pattern. The non-conductive regions 510 have a pattern opposite to that of the conductive region 501. As shown in FIG. 1 and FIG. 2, each conductive region 501 is larger than each non-conductive region 510.

The smaller the conductive regions 501 and the larger the non-conductive regions 510, the less the earth portion 5 is creased. However, if the conductive regions 501 are small, the earth has to be brought into contact with an earth portion of the display cabinet or display body (to be described later) at less points, which inevitably increases an electric resistance in a path absorbing electromagnetic waves (i.e. the path absorbs electric energy produced by converting electromagnetic waves), and adversely affects the essential electromagnetic wave shielding performance. The earth portion 5 is required to satisfy these contradictory requirements.

For instance, when the earth portion 5 has a width t of 5 mm to 15 mm (as shown in FIG. 1 and FIG. 2), each conductive region 501 is 5 mm to 100 mm long, or preferably 10 mm to 50 mm long, while each non-conductive region 510 is 1 mm wide, is in the shape of a slit and is sandwiched between two adjacent conductive regions 501. In other words, the conductive regions 501 of the earth portion 5 are regularly separated by the non-conductive regions 510.

The aperture ratio of the conductor 4 of the electromagnetic wave shield film 1 is 50% to 98%, 70% to 98%, or preferably 80% to 98% in order to improve the visibility and the electromagnetic wave shielding performance. For instance, when the conductor 4 has a mesh geometric pattern whose line width is 5 $\mu$m and line pitch is 250 $\mu$m, the open area thereof is 96%. When the line width is 17 $\mu$m and the line pitch is 250 $\mu$m, the aperture ratio is 86.8%. When the line width is 5 $\mu$m and the line pitch is 300 $\mu$m, the aperture ratio is 96.7%. When the line width is 17 m and the line pitch is 300 $\mu$m, the aperture ratio is 89%.

[First Structure of Electromagnetic Wave Shield Unit]

Figure 3A:
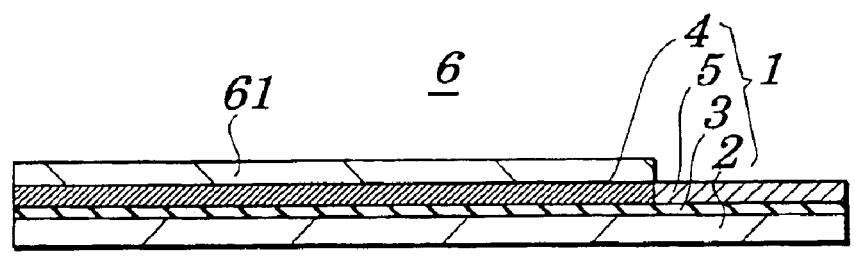
FIG. 3A is a cross section of an electromagnetic wave shield unit having a first structure.

The electromagnetic wave shield film 1 constitutes a front plate or a part of a display in an electromagnetic wave shield unit 6. Referring to FIG. 3A, the electromagnetic wave shield unit 6 comprises the electromagnetic wave shield film 1 and a protective film 61 on a conductor of the electromagnetic wave shield film 1. The protective film 61 is preferably of a releasable type and is stripped when the electromagnetic wave shield unit 6 is actually used. Alternatively, the protective film 61 may remain attached permanently.

An adhesive may be applied between the conductor 4 and the protective film 61, and be made of the material same as that of the foregoing adhesive 3. Further, the protective film 61 may be attached not only to a single surface of but also to the opposite surfaces of the electromagnetic wave shield film 4 (i.e. on the conductor 4 and on the under surface of the transparent base 2).

[Second Structure of Electromagnetic Wave Shield Unit]

Figure 3B:
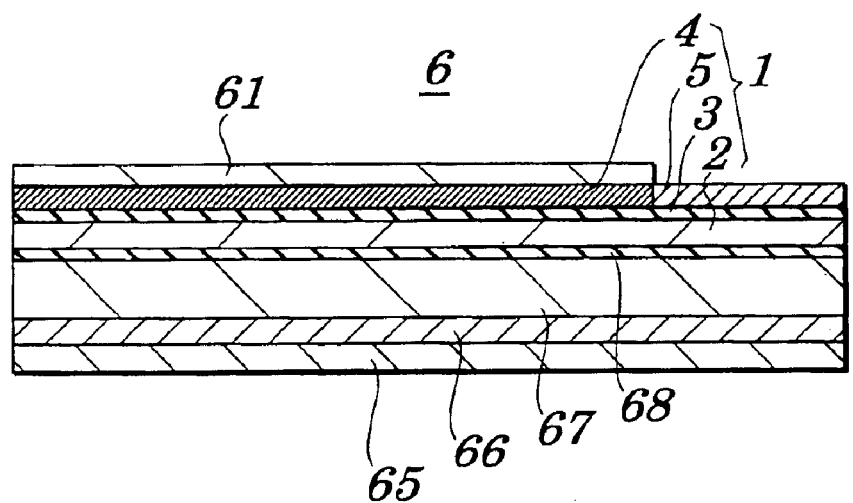
FIG. 3B is a cross section of an electromagnetic wave shield unit having a second structure.

Referring to FIG. 3B, the electromagnetic wave shield unit 6 comprises an anti-reflection film 65, an infrared ray absorbing film 66 on the anti-reflection film 65, a first transparent base 67 on the infrared ray absorbing film 66, an electromagnetic wave shield film 1, and a protective film 61 at least on the conductor 4 of the electromagnetic wave shield film 1. The components except for the films 65 and 66 are the same as those in the electromagnetic wave shield unit 6 of FIG. 3A. The electromagnetic wave shield film 1 includes the transparent base 2 (i.e. second transparent base), conductor 4 having the mesh geometric pattern and provided on the second transparent base 2, and earth portion 5 provided around the conductor 4 and having conductive and non-conductive regions 501 and 510.

Although not shown, an adhesive similar to the adhesive 3 is applied between the anti-reflection film 65 and the infrared ray absorbing film 66, which are bonded. The transparent base 67 is preferably a transparent glass or plastic plate.

[Structure of Front Plate]

The electromagnetic wave shield unit 6 constitutes a front plate 7 via which the electromagnetic wave shield film 1 is attached to the display. The front plate 7 includes at least the electromagnetic wave shield unit 6 with the electromagnetic wave shield film 1, a bracket 71 attached to the peripheral edge of the electromagnetic wave shield unit 6, and bezel (escutcheon) 70 via which the electromagnetic wave shield unit 6 is attached using the bracket 71.

Figure 4:
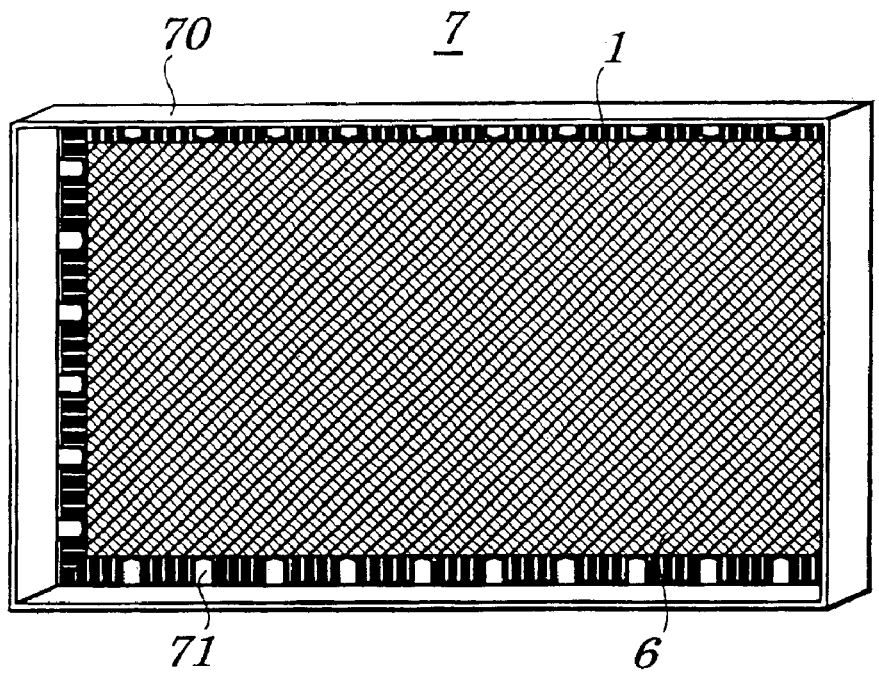
FIG. 4 is a perspective view of a front plate according to the embodiment the invention.
Figure 5:
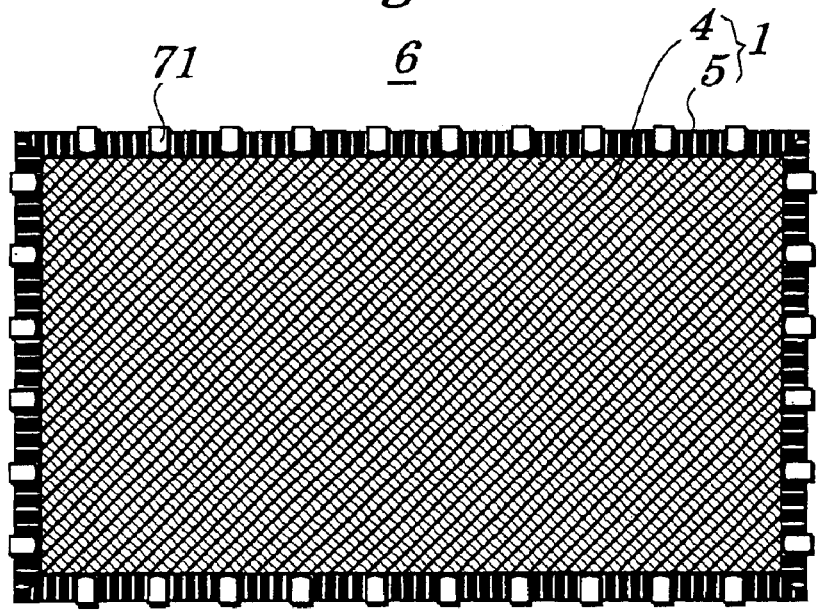
FIG. 5 shows the electromagnetic wave shield film and a bracket according to the embodiment of the invention.
Figure 6:
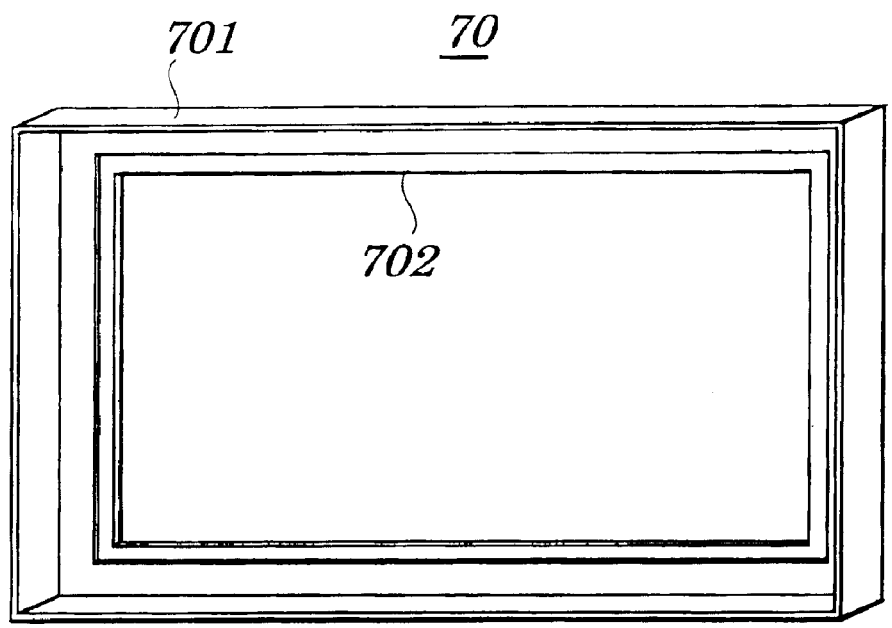
FIG. 6 is a perspective view of a front plate of a cabinet for an electromagnetic wave shield unit according to the embodiment of the invention.
Figure 7:
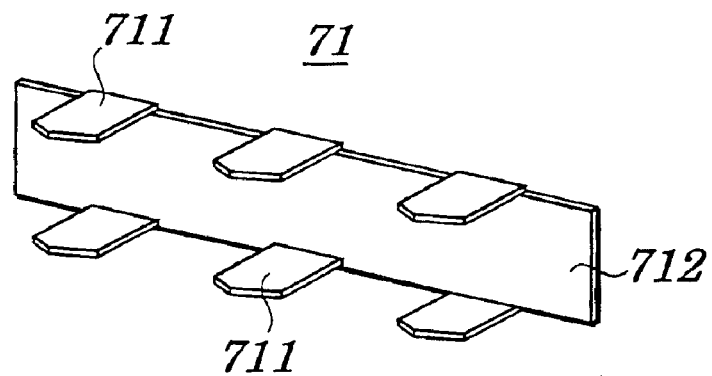
FIG. 7 is a perspective view of the bracket.

As shown in FIG. 4, FIG. 5 and FIG. 7, the bracket 71 is provided with a plurality of regularly spaced grips 711, and a joint 712 joining the grips 711. The grips 711 elastically hold the front and rear surfaces of the electromagnetic wave shield unit 6 and are in electrical contact with the earth portion 5 of the electromagnetic wave shield film 1. The grips 711 are made of a metal or an alloy since they have to be at least conductive and elastic. The joint 712 and grips 711 may be either integral or separate.

The bezel 70 is shaped similarly to the electromagnetic wave shield unit 6, and has a peripheral edge 701 into which the electromagnetic wave shield unit 6 is fitted, and an opening 702. The bezel 70 is made of a resin, metal or alloy in order to be easily molded.

[Structure of Display]

Figure 8:
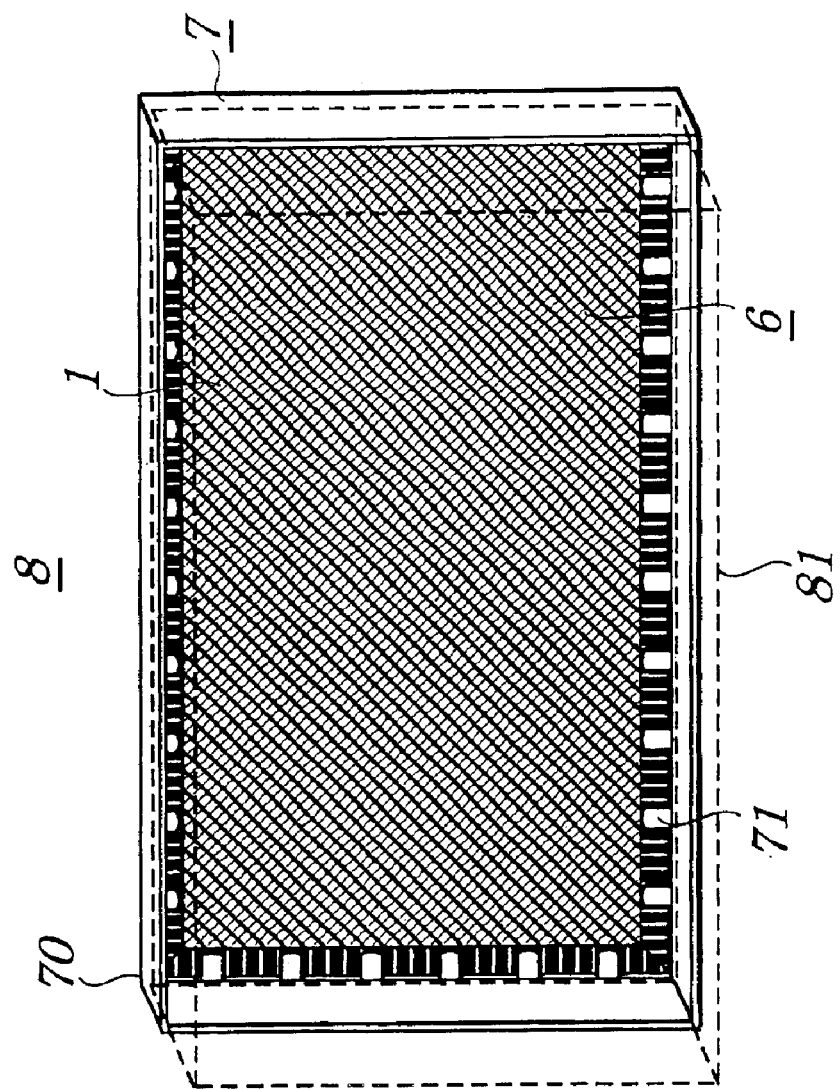
FIG. 8 is a perspective view of a display according to the embodiment of the invention.

Referring to FIG. 8, the display 8 includes a display module 81, and the bezel 7 (or the electromagnetic wave shield film 1 or the electromagnetic wave shield unit 6) attached to a screen of the display module 81.

The display module 81 is a plasma display module (whose structure is not described in detail here) in this example, which includes at least a plasma display panel and a display cabinet for housing the plasma display panel. The earth portion 5 of the electromagnetic wave shield film 1 is grounded via the bracket 71 attached to the front plate 7 of the plasma display panel or display cabinet. The front plate 7 is screwed and fastened to the display module 81 from the rear side thereof.

Alternatively, the display module 81 may be a cathode ray tube display, a liquid crystal display, an electro luminescence display or the like.

[Second Structure of Earth Portion of Electromagnetic Wave Shield Film]

Figure 9:
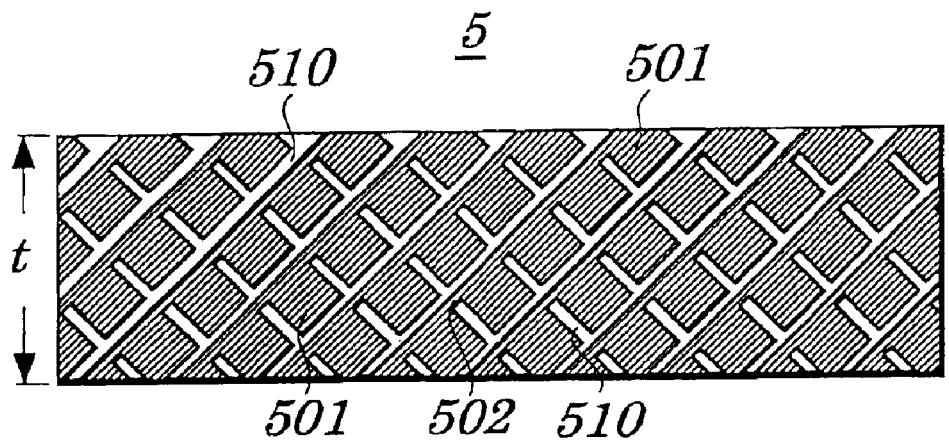
FIG. 9 is an enlarged plan view of an earth portion of the electromagnetic wave shield film, the earth portion having the second structure.

The earth portion includes conductive regions 501 each of which has a mesh rectangular geometric pattern as shown in FIG. 9, and non-conductive regions 510 each of which has a pattern opposite to that of the conductive region 501. In the earth portion 5, a total area of the conductive regions 501 is larger than that of the non-conductive regions 510.

Further, the patterns on the conductor 4 and on the conductive regions 510 are determined in order to assure an electrical connection therebetween. Still further, the conductive regions 501 are separated by the non-conductive regions 510. The conductive regions 501 in each right (or left) diagonal row are electrically connected by conductive joints 502.

When the earth portion 5 has the width t (shown in FIG. 1 and FIG. 9) which is 5 mm to 15 mm, one side of the conductive region 501 is 5 mm to 100 mm, or preferably 10 mm to 50 mm. The conductive joint 502 is 2 mm wide, and the non-conductive region 510 is 1 mm wide. The width t is the same in a third and succeeding structures.

The conductive regions 501 and the non-conductive regions 510 are alternately arranged at regular and equal intervals, so that the mesh geometrical pattern of the conductive regions 501 becomes discontinuous. Therefore, if it is necessary to electrically connect the conductive regions 501, a 2 mm wide conductive strip (not shown) may be provided along the peripheral edge of the conductor 4 in order to make the mesh geometric pattern partially continuous. Refer to the following description of third to fifth structures of the earth portion 5.

[Third Structure of Earth Portion of Electromagnetic Wave Shield Film]

Figure 10:
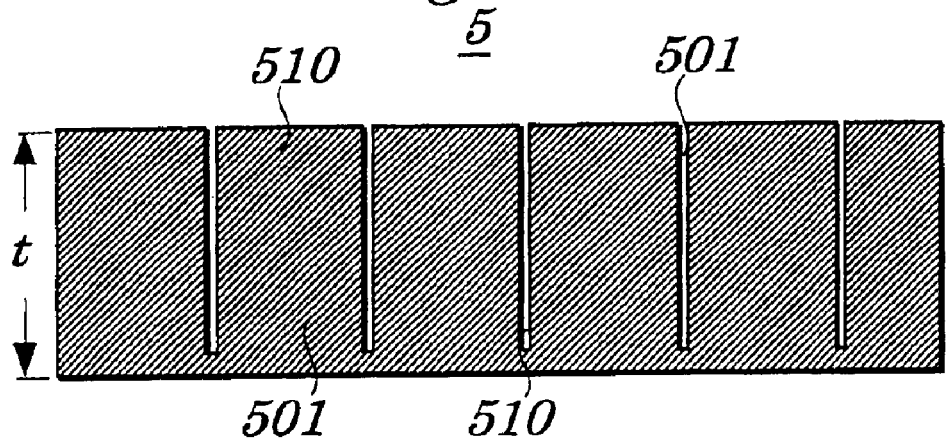
FIG. 10 is an enlarged plan view of an earth portion of an electromagnetic wave shield film, the earth portion having a third structure.

Referring to FIG. 10, the earth portion 5 may have non-conductive regions 510 in the shape of a slit, so that conductive regions 501 are in the shape of teeth of a comb. Each slit-shaped non-conductive region 510 extends outward from a side in contact with the conductor 4, and is 1 mm wide, for example. Each conductive region 501 is 5 mm to 100 mm long, or preferably 10 mm to 50 mm long. The conductive regions 501 become continuous.

[Fourth Structure of Earth Portion of Electromagnetic Wave Shield Film]

Figure 11:
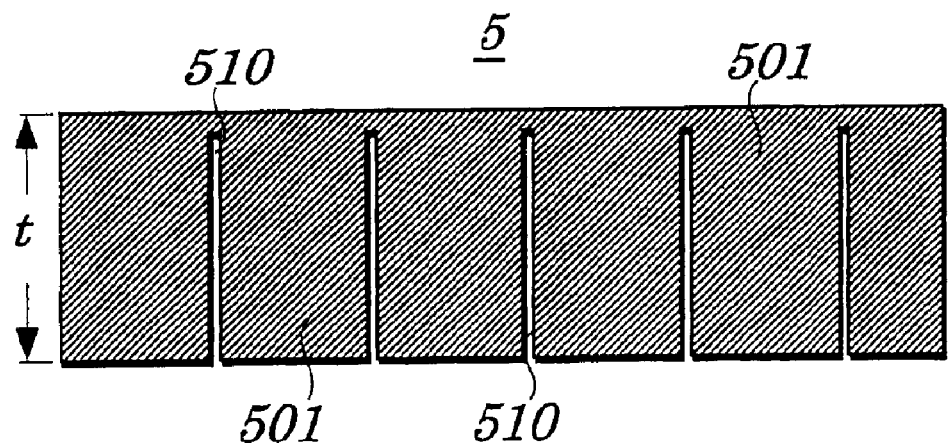
FIG. 11 is an enlarged plan view of an earth portion of an electromagnetic wave shield film, the earth portion having a fourth structure.

With a fourth structure, the earth portion 5 may have non-conductive regions 510 in the shape of a slit while conductive regions 501 are in the shape of teeth of a comb, as shown in FIG. 11. The conductive regions 501 are oriented in a direction opposite to the conductive regions 501 shown in FIG. 10, i.e. the non-conductive regions 510 extend toward the conductor 4.

[Fifth Structure of Earth Portion of Electromagnetic Wave Shield Film]

Figure 12:
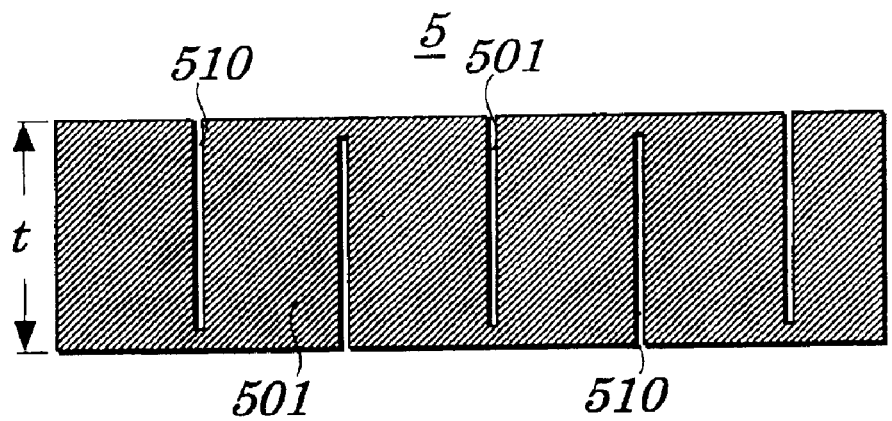
FIG. 12 is an enlarged plan view of an earth portion of an electromagnetic wave shield film, the earth portion having a fifth structure.

Referring to FIG. 12; the earth portion 5 may have non-conductive regions 510 which are alternately oriented in the opposite directions, so that conductive regions 501 are in zigzags. Specifically, the non-conductive regions 510 are alternately oriented inward and outward from the conductor 4. The width of the non-conductive regions 510 and the length of the conductive regions 501 are the same as those of the earth portion 5 having the third or fourth structure. The conductive regions 501 in zigzags are continuous.

[Sixth Structure of Earth Portion of Electromagnetic Wave Shield Film]

Figure 13:
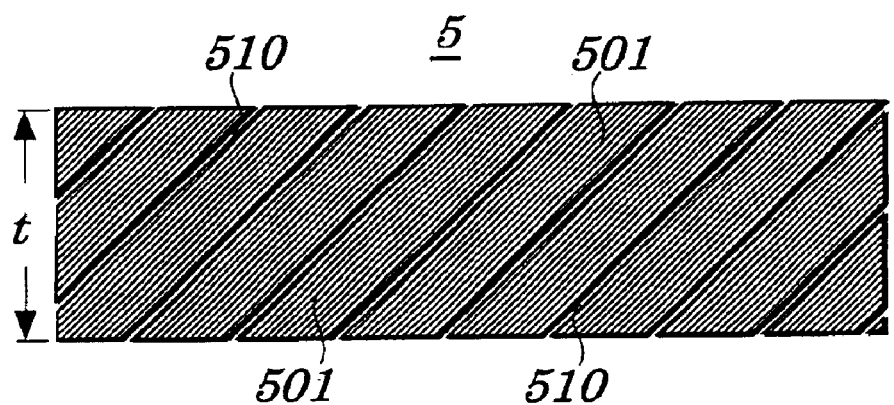
FIG. 13 is an enlarged plan view of an earth portion of an electromagnetic wave shield film, the earth portion having a sixth structure.

The earth portion 5 may have conductive regions 501 in the shape of a parallelogram and upward sloping non-conductive regions 510, which are positioned between the conductive regions 501. Refer to FIG. 13. Each non-conductive region 510 is as wide as the non-conductive regions 510 having the third or fourth structure. Each conductive region 501 is as long as the conductive region having the third or fourth structure.

[Seventh Structure of Earth Portion of Electromagnetic Wave Shield Film]

Figure 14:
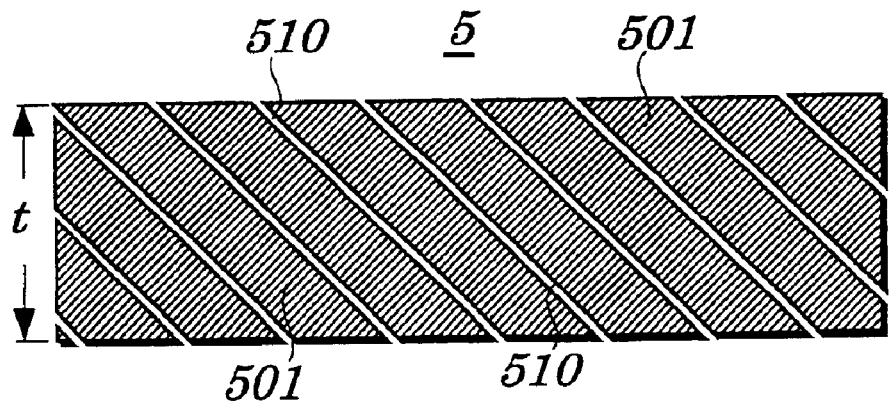
FIG. 14 is an enlarged plan view of an earth portion of an electromagnetic wave shield film, the earth portion having a seventh structure.

The earth portion 5 may have conductive regions 501 in the shape of a parallelogram and downward sloping non-conductive regions 510, which are positioned between the conductive regions 501. Refer to FIG. 14. This structure is similar to the sixth structure (shown in FIG. 13), but the non-conductive regions 510 slope in the direction opposite to that of the sixth structure.

[Eighth Structure of Earth Portion of Electromagnetic Wave Shield Film]

Figure 15:
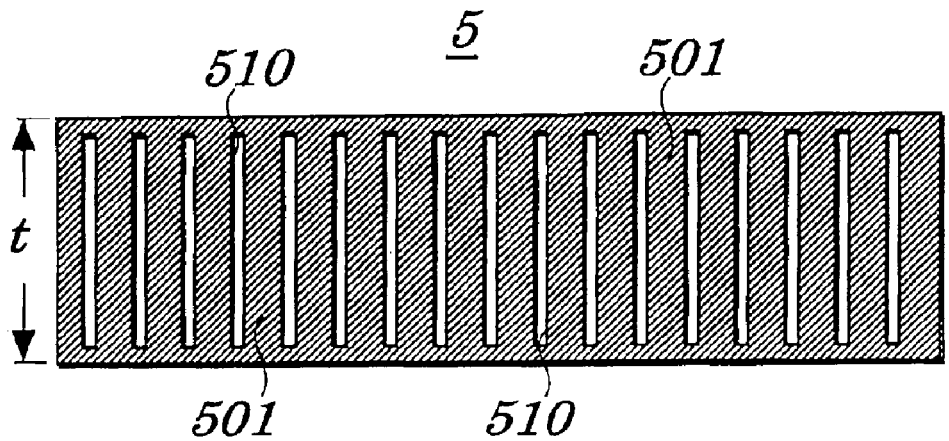
FIG. 15 is an enlarged plan view of an earth portion of an electromagnetic wave shield film, the earth portion having an eighth structure.

Referring to FIG. 15, the earth portion 5 may have a conductive region 501 in which slit-shaped non-conductive regions 510 are arranged at regular intervals. In other words, the earth portion 5 has a ladder pattern. The non-conductive regions 510 are positioned substantially at the center of the earth portion 5 in order to arrange the conductive region 510 along the peripheral edges of the conductor 4. The width of each non-conductive region 510 and the length of the conductive region 501 are the same as those of the third or fourth structure. With this structure, the conductive region 501 is partially continuous, and is electrically connected to the peripheral edge of the conductor 4.

[Ninth Structure of Earth portion of Electromagnetic Wave Shield Film]

Figure 16:
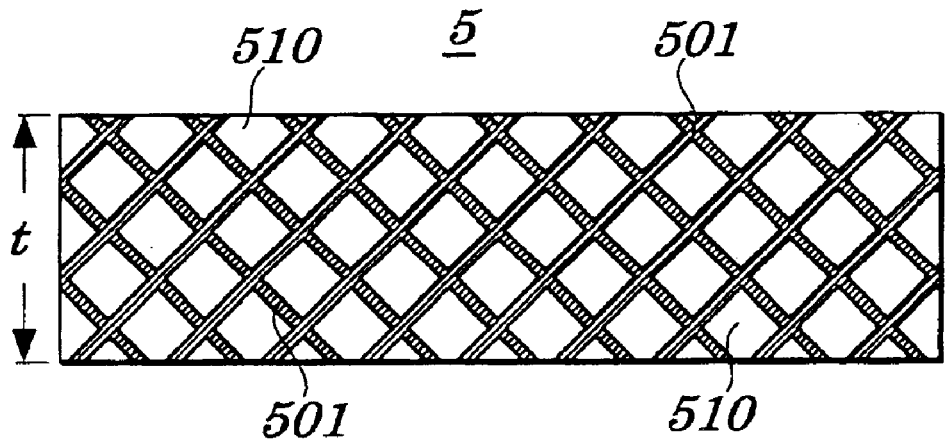
FIG. 16 is an enlarged plan view of an earth portion of an electromagnetic wave shield film, the earth portion having a ninth structure.

The earth portion 5 may have a mesh geometric pattern as shown in FIG. 16. Specifically, the conductive region 501 is in the shape of a mesh while non-conductive regions 510 are in the shape of a rectangle surrounded by the conductive region 501. The mesh geometric pattern of the earth portion 5 in FIG. 16 is opposite to that shown in FIG. 9.

[Basic Method of Manufacturing Electromagnetic Wave Shield Film]

The following describe a basic method of manufacturing the electromagnetic wave shield films 1. The electromagnetic wave shield film 1 having the earth portion 5 of the first structure will be described as an example. This method is also applicable to manufacturing of the electromagnetic wave shield films 1 with the earth portions 5 having the second to ninth structures.

(1) First of all, the transparent base 2 is prepared. A metal layer is laminated on the transparent base 2 using the adhesive 3. Specifically, the metal foil is bonded onto the transparent base 2 by applying the adhesive 3 to either the metal foil or the transparent base 2 or to both of them. Then, the metal foil and transparent base 2 are dried. Any known bonding and drying processes are applicable. Further, the metal foil may be bonded by pressure application, a roll laminating process, or an autoclaving process, for example. The roll laminating process is most preferable in view of workability and economical efficiency The metal layer may be formed also by bonding the metal foil on an adhesive layer using the vacuum deposition process, sputtering process, ion plating process, chemical vapor deposition process, electroless or electric plating, or by using two or more of the foregoing processes. These processes are effective in easily thinning the metal layer. Further, the adhesive 3 may be dispensable when the foregoing processes are adopted.

The conductor 4 and earth portion 5 are made of the same metal foil.

(2) A mesh geometric pattern is formed on the metal layer in order to make the conductor 4. The metal layer for the earth portion 5 is left along the peripheral edge of the conductor 4. Then, the metal layer is removed from positions corresponding to the non-conductive regions 510, so that the conductive regions 501 are left on the earth portion 5.

The mesh geometric pattern is preferably formed by the micro-lithographic process in order to assure processing precision and efficiency.

The following mesh geometric patterns are usable, and may be composed of triangles (i.e. equilateral triangles, right-angled triangles and isosceles triangles), quadrangles (i.e. squares, rectangles, rhombuses, rhomboids and trapezoids), polygons and regular polygons having "n" angles (e.g. hexagons, regular hexagons, octagons, regular octagons, dodecagons, regular dodecagons, shapes having icosahedrons, and regular shapes with icosahedrons), circles, ovals, pentacles and so on.

The micro-lithographic process may refer to the photolithographic process, X-ray lithographic process, electronic ray lithographic process, ion beam lithographic process and so on. In addition, a screen-printing process is applicable. The photolithographic process is the most convenient and suitable to mass production. Further, the photolithographic process based on the chemical etching process is the most preferable because of its convenience, economical efficiency and high processing precision.

With the photolithographic process, the conductor 4 may be formed with a mesh geometric pattern by using the electroless or electric plating process, combination of electroless and electric plating processes or chemical etching process.

When the adhesive 3 is thermoplastic, the metal foil may be processed by the micro-lithography in order to form the mesh geometric pattern on the conductor 4 and the conductive regions 501 of the earth portion 5. In such a case, the adhesive 3 remains sticky even after the micro-lithographic process.

It is assumed here that the adhesive 3 is of a thermosetting type. The metal foil is placed on the transparent base 2 via the adhesive 3, which is heated and is hardened in order to bond the base 2 and the metal foil in the process (1) mentioned above. However, the metal foil may be subject to the micro-lithography in order to form the mesh geometric pattern on the conductor 4 and the conductive region 501 of the earth portion 5 before heating and hardening the adhesive 3 or by suppressing a hardening extent of the adhesive 3 (preferably to 60% or less). In such a case, the adhesive 3 remains sticky. The hardening extent is derived as a ratio of a heating peak of a material before hardening to a heating peak of the material which is partly heated and hardened, using a differential scanning calorimeter (DSC).

Further, it is assumed that the adhesive 3 is of a type hardened by active energy rays. In this case, the active energy rays are applied to the adhesive 3 via the transparent base 2 on which the metal foil is placed. However, the metal foil may be subject to the micro-lithographic process in order to form the mesh geometric pattern on the conductor 4 and the conductive region 501 before heating and hardening the adhesive 3 or by suppressing the hardening extent thereof. Even after this process, the adhesive 3 still remains sticky.

(3) The conductor 4 with the mesh geometric pattern is completed together with the conductive and non-conductive regions 501 and 510 of the earth portion 5. The conductor 4 and the conductive and non-conductive regions 501 and 510 may be independently formed. Further, the conductor 4 and the conductive and non-conductive regions 501 and 510 may be formed on separate bases, and are then combined, thereby obtaining the electromagnetic wave shield film 1. The conductor 4 is blackened before after the formation of the geographic pattern. Generally speaking, the conductor 4 is preferably blackened after making the mesh geometric pattern thereon.

Alternatively, a mask which has a pattern opposite to the geometric pattern to be made on the conductor 4 and conductive regions 501 may be prepared. Then, a metal layer may be made on the transparent base 2 by using the mask and using the vacuum deposition, sputtering, ion plating, chemical deposition, or electroless/electric plating process. In this case, the metal layer can be bonded to the transparent base 2 without using the adhesive 3.

Further, the conductor 4 and conductive regions 501 may be made by screen-printing a mesh geometric pattern on the transparent base 2 using an ink which is made of a resin containing a conductive metal powder, a conductive carbon powder, a conductive resin, an ink made of constituents of the foregoing ink, or a conductive organic material.

The embodiment of the invention will be now described with reference to first to third examples, which are compared with first and second comparison examples of the related art.

FIRST EXAMPLE

The transparent base 2 is a 100 $\mu$m thick polyethylene terephthalate (PET) film (brand name "EMBLET S" manufactured by Unitika Ltd.), and the adhesive 3 is a polyester resin (brand name "BYRON UR-1400" manufactured by Toyo Boseki Kabushiki Kaisha). The adhesive 3 is applied onto the transparent base 2 using a painting machine at a room temperature so that the adhesive 3 is 30 $\mu$m thick when dried. A 18 $\mu$m thick copper foil (brand name "BHY-22B-T" manufactured by Japan Energy, Ltd.) is roll-laminated onto the transparent base 2 in order to make the conductor 4 and the conductive regions 501 under conditions of 150° C. and 196×10$^4$ Pa. In this case, a coarse surface of the copper foil is in contact with the adhesive 3. A film on which the conductor 4 and conductive regions 501 are laminated is obtained.

Figure 17:
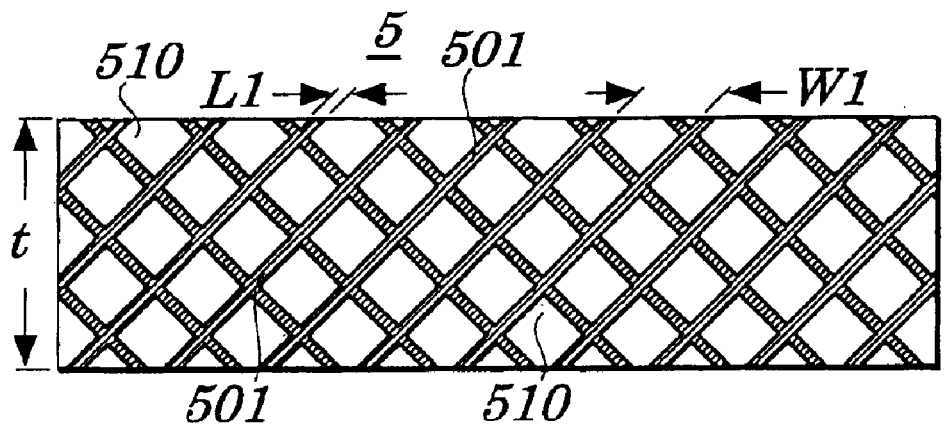
FIG. 17 is an enlarged plan view of an earth portion of an electromagnetic film according to a first example of the invention.

A mesh geometric pattern which has a line width of 25 $\mu$m and a line space of 250 $\mu$m is made on the conductor 4 by the photolithographic process. Further, the mesh geometric pattern of FIG. 17 is made on the earth portion 5 (surrounding the conductor 4) in order to obtain the conductive and non-conductive regions 501 and 510. The earth portion 5 of FIG. 17 is identical to that shown in FIG. 16. A length L1 of the conductive region 501 corresponds to the line width of the conductor 4, and is 2 mm. A width W1 corresponds to the line space of the conductor 4, and is 10 mm. The earth portion 5 is 12 mm wide. The photolithographic process includes at least bonding, exposing, developing, chemical etching and stripping resist film (DFR).

After the chemical etching, the surface of the adhesive 3 becomes opaque because the coarse surface of the copper foil has been transferred thereto. In order to obtain the transparent electromagnetic wave shield film 1 having the first structure, the surface of the copper foil on the conductive regions 501 and the adhesive 3 made of an adhesive PET film are heated and pressed under the conditions of 120° C. and 49×10$^4$ Pa.

SECOND EXAMPLE

Figure 18:
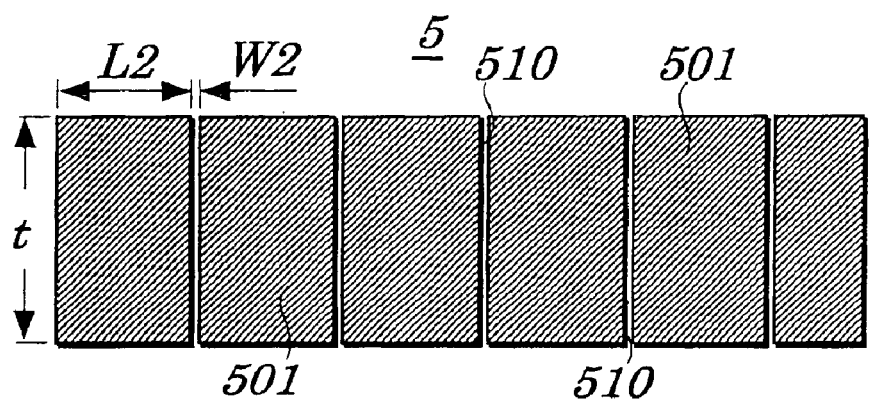
FIG. 18 is an enlarged plan view of an earth portion of an electromagnetic film according to a second example of the invention.

The forgoing conditions are applied in order to make conductor 4 with the mesh geometric pattern, the earth portion 5 having the conductive regions 501 with the rectangular geometric pattern (shown in FIG. 18) and the non-conductive regions 510 in the shape of a slit. The earth portion 5 of FIG. 18 is identical to the earth portion 5 having the first structure, shown in FIG. 2. In this example, the conductive region 501 has a length L2 of 100 mm while the slit width W2 is 5 mm.

As described in the first example, after the chemical etching, the surface of the adhesive 3 becomes opaque because the coarse surface of the copper foil has been transferred thereto. In order to obtain the transparent electromagnetic wave shield film 1 having the second structure, the surface of the copper foil on the conductive regions 501 and the adhesive PET film as the adhesive 3 are heated and pressed under the conditions of 120° C. and 49×10$^4$ Pa.

THIRD EXAMPLE

Figure 19:
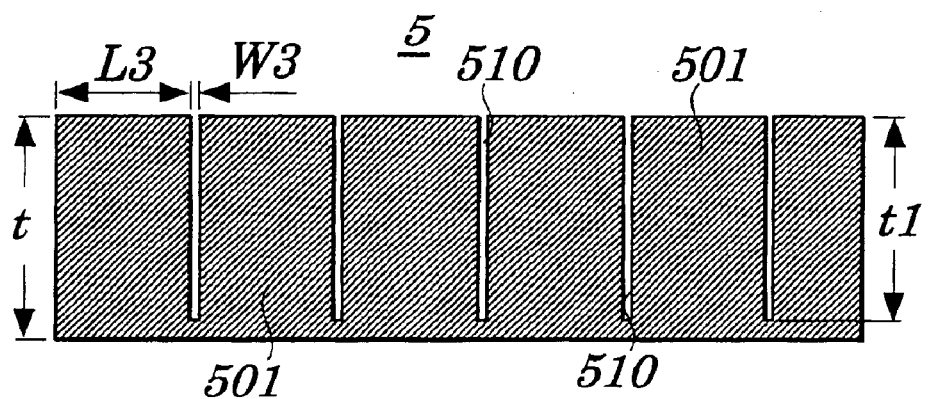
FIG. 19 is an enlarged plan view of an earth portion of an electromagnetic film according to a third example of the invention.
Figure 20:
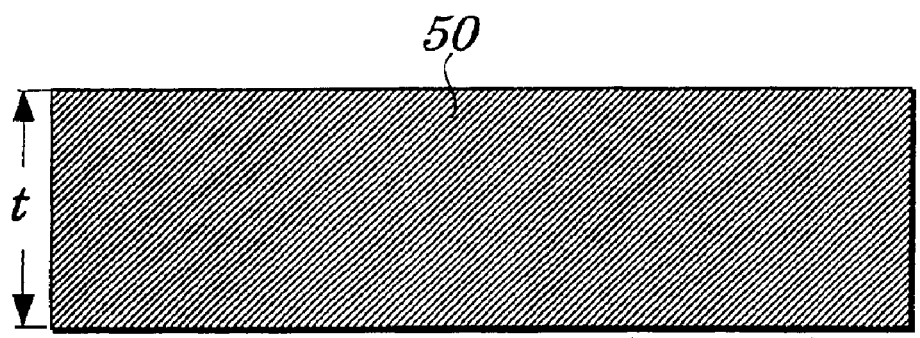
FIG. 20 is an enlarged plan view of an earth portion of a first comparison example of the electromagnetic wave shield film.

The conditions mentioned in the first example are also applied in this example. The conductor 4 has the mesh geometric pattern while the earth portion 5 includes the comb-shaped conductive regions 501 and the slit-shaped non-conductive regions 510, as shown in FIG. 19. The earth portion 5 shown in FIG. 19 is identical to the earth portion 5 having the third structure shown in FIG. 10. The length L3 of the conductive region 501 is 100 mm, the slit width W3 is 5 mm, and the length t1 of the non-conductive region 510 is 2 mm.

After the chemical etching, the surface of the adhesive 3 also becomes opaque because the coarse surface of the copper foil has been transferred thereto. In order to obtain the transparent electromagnetic wave shield film 1 having the second structure, the surface of the copper foil on the conductive regions 501 and the adhesive PET film as the adhesive 3 are heated and pressed under the conditions of 120° C. and 49×10$^4$ Pa.

First Comparison Example

A first comparison example is made under the conditions mentioned with respect to the foregoing first example. A conductor 4 has a mesh geometric pattern, and an earth portion 50 has only a conductive region (without any non-conductive region). The earth portion 50 has a width t of 12 mm.

After the chemical etching, the surface of the adhesive 3 also becomes opaque because the coarse surface of the copper foil has been transferred thereto. In order to obtain the transparent electromagnetic wave shield film 1 having the fourth structure, the surface of the copper foil on the conductive region and the adhesive PET film as the adhesive 3 are heated and pressed under the conditions of 120° C. and 49×10$^4$ Pa.

Second Comparison Example

Figure 21:
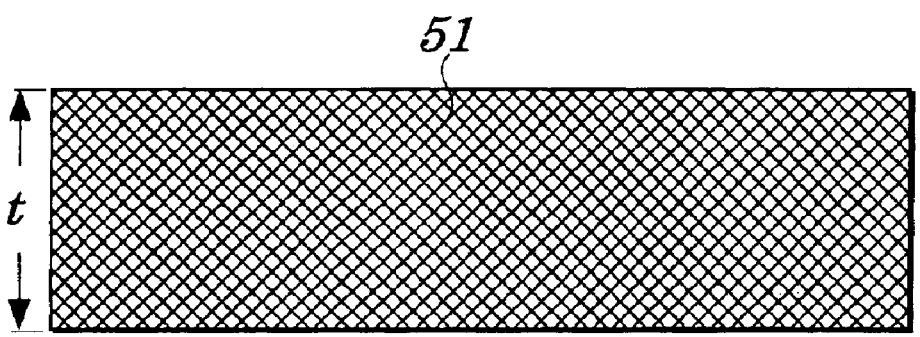
FIG. 21 is an enlarged plan view of an earth portion of a second comparison example of the electromagnetic wave shield film.

A second comparison example is made under the conditions mentioned with respect to the foregoing first example. A conductor 4 has a mesh geometric pattern, and an earth portion 51 has the mesh geometric pattern same as that of the conductor 4, as shown in FIG. 21. In the mesh geometric pattern, the line width is 25 μm, and the line space is 250 μm. The earth portion 51 has a width t of 12 mm.

After the chemical etching, the surface of the adhesive 3 also becomes opaque because the coarse surface of the copper foil has been transferred thereto. In order to obtain the transparent electromagnetic wave shield film 1 having the fifth structure, the surface of the copper foil on the conductive region and the adhesive PET film as the adhesive 3 are heated and pressed under the conditions of 120° C. and $49 \times 10^4$ Pa.

Performance Analysis of Examples and Comparison Examples

Electromagnetic wave shielding performance (EMI), visible light transmission factors and creases were measured for the electromagnetic wave shield films 1 having the first to third structure in the examples of the present invention and for the electromagnetic wave shield films 1 having the fourth and fifth structures in the comparison examples. FIG. 22 shows not only measurement results but also an aerial ratio of the conductive area 501 to the earth portion 5, an aerial ratio of the earth portion 50, and an aerial ratio of the earth portion 51.

The electromagnetic wave shielding performance was measured using a coaxial wave guide tube (brand name "TWC-S-024" manufactured by Japan High Frequency Co., Ltd.), a spectrum analyzer (band name "8510B VECTOR NETWORK ANALYZER" manufactured by YHP). The measurement was performed at 1 GHz by sandwiching specimens between flanges of the coaxial wave guide tube.

The visible light transmission factors were measured using a double beam spectrophotometer (brand name "TYPE 200-10" manufactured by Hitachi, Ltd.). The transmission factors of 380 nm to 780 nm were measured. FIG. 22 shows averages of the measured transmission factors.

Pitches and height of creases on the earth portion were measured at nine optional positions, and were averaged.

Referring to FIG. 22, the electromagnetic wave shield films 1 having the first to third structures (in the first to third examples) demonstrate relatively high electromagnetic wave shielding performance of 51 dB to 56 dB, and sufficient visible light transmission factors of 71% to 72%. These films have a crease pitch of 7 cm or larger, and the crease height of 10 mm or less. As a result, it is possible to reduce creases to a level which is substantially negligible from a practical standpoint.

The electromagnetic wave shield films having the fourth and fifth structures in the comparison examples demonstrate high electromagnetic wave shielding performance and high visible light transmission factors. However, the comparison results show that these films have a crease pitch of 4.7 cm and crease height of 18 mm. In other words, the earth portion 50 suffers from a lot of creases.

When the earth portion of the electromagnetic wave shield film of the first comparison example is placed between flanges of the tester by applying a large force, the shield film can demonstrate target electromagnetic wave shielding performance. However, application of such a strong force does not seem to be commercially practical for the mass production. Further, it is assumed here that the foregoing film having a lot of creases is bonded onto a glass plate using an adhesive in order to obtain a front plate, and that earth portions of the front plate and a display cabinet including a plasma display module are bonded in a usual manner. The electromagnetic wave shielding performance of such a display is lower by approximately 10% than that of a display including the electromagnetic wave shield film which is substantially free of creases in the first example.

The electromagnetic wave shield film having the fifth structure in the second comparison example demonstrates high visible light transmission factor similarly to the electromagnetic wave shield films having the first to third structures. However, having the crease pitch of 7 cm or larger, and crease height of 10 mm or less, the shield film of this comparison example cannot demonstrate sufficient electromagnetic wave shielding performance.

As described above, the electromagnetic wave shield films 1 of the present invention includes the non-conductive regions 510, which enable the conductive regions 501 to freely contract and expand. This is effective in preventing the earth portion 5 from being creased.

Further, in the electromagnetic wave shield films 1 of the embodiment of the present invention, the occupancy ratio of the conductive regions 501 on the earth portion 5 is appropriately controlled in order not only to maximize the electromagnetic wave shielding performance but also to minimize the creases on the earth portion 5.

Still further, it is possible to easily improve the electromagnetic wave shielding performance and preventing creases by changing planar patterns on the conductive regions 501 and/or non-conductive regions 510 of the earth portion 5.

Other Examples

The invention has been described with respect to some examples, in which each electromagnetic wave shield film 1 includes the conductive regions 501 and non-conductive regions 510 arranged alternately in the earth portion 5. Alternatively, a plurality of conductive regions 501 having a rectangular geometric pattern with the same length may be separated by each conductive region having a length different from the foregoing length. Further, non-conductive regions 510 having different slit widths may be provided.

Further, both the conductive regions 501 and non-conductive regions 510 may have triangular, rectangular, square and polygonal patterns, or oval, circular or pentacle patterns.

Although the present invention have been described and illustrated in detail, it is to be clearly understood that the same is by way of illustration and example only, and is not to be taken by way of limitation. The spirit and scope of the present invention are to be limited only the terms of the appended claims.

[Effects of the Invention]

The invention provides the electromagnetic wave shield films which can improve the electromagnetic wave shielding performance and protect the display body against damages.

Further, the invention provides the electromagnetic wave shield unit which can assure the foregoing features.

Still further, the invention provides the display which can assure the foregoing features.

What is claimed is:

1. An electromagnetic wave shield film comprising:
   a transparent base;
   a conductor mounted on said transparent base and having a geometric pattern; and
   an earth portion arranged around the conductor and having conductive regions and non-conductive regions.

2. The electromagnetic wave shield film of claim 1, wherein said conductive regions occupy 30% to 99% of said earth portion.

3. The electromagnetic wave shield film of claim 1, wherein said conductive region occupies 60% to 99% of said earth portion.

4. The electromagnetic wave shield film of claim 1, wherein said conductive regions occupy 65% to 97% of said earth portion.

5. The electromagnetic wave shield film of claim 1, wherein said conductive region has at least one of geometric patterns (1) to (10):
   (1) a comb-shaped pattern;
   (2) a rectangular geometric pattern;
   (3) a zigzag pattern;
   (4) a parallelogram pattern;
   (5) a ladder-shaped pattern;
   (6) a mesh geometrical pattern;
   (7) a triangular pattern;
   (8) a pentagonal or polygonal pattern;
   (9) a circular or oval pattern; and
   (10) a pentacle pattern.

6. The electromagnetic wave shield film of claim 1, wherein said conductor and said conductive regions are mounted on said transparent base using an adhesive.

7. The electromagnetic wave shield film of claim 6, wherein said transparent base is a transparent plastic, said conductor and said conductive regions of said earth portion are made of metal or alloys, and said adhesive is a polymer group adhesive.

8. The electromagnetic wave shield film of claim 7, wherein said each conductive region is 3 μm or more thick.

9. The electromagnetic wave shield film of claim 8, wherein said each conductive region is 40 μm or less thick.

10. The electromagnetic wave shield film of claim 1, wherein an aperture ratio of said conductor is a 50% to 98%.

11. The electromagnetic wave shield film of claim 1, wherein the non-conductive region is a region free of conductors so as to prevent the earth portion from being creased.

12. An electromagnetic wave shield unit comprising:
   an electromagnetic wave shield film which includes a transparent base, a conductor mounted on said transparent base and having a mesh geometric pattern, an earth portion provided around said conductor and having conductive regions and non-conductive regions; and
   a protective film provided at least on said conductor of said electromagnetic wave shield film.

13. An electromagnetic wave shield unit comprising:
   an electromagnetic shied film which includes: an anti-reflection film; a near infrared ray absorbing film; a first transparent base on said near infrared ray absorbing film; a second transparent base on said first transparent base; a conductor on said second transparent base and having a mesh geometric pattern; and an earth portion provided around said conductor and having conductive regions and non-conductive regions; and
   a protective film provided at least on said conductor of said electromagnetic wave shield film.

14. The electromagnetic wave shield unit of claim 12, wherein said conductive regions occupy 30% to 99% of said earth portion.

15. The electromagnetic wave shield unit of claim 12, wherein said each conductive region of said earth portion has at least one of geometric patterns (1) to (10):
   (1) a comb-shaped pattern;
   (2) a rectangular geometric pattern;
   (3) a zigzag pattern;
   (4) a parallelogram pattern;
   (5) a ladder-shaped pattern;
   (6) a mesh geometrical pattern;
   (7) a triangular pattern;
   (8) a pentagonal or polygonal pattern;
   (9) a circular or oval pattern; and
   (10) a pentacle pattern.

16. A display comprising:
   a display module; and
   an electromagnetic wave shield unit which includes at least: a transparent base on said display module, a conductor on said transparent base and having a mesh geometric pattern, an earth portion provided around said conductor and having a conductive region and a non-conductive region; and a protective film at least on said conductor of said electromagnetic wave shield film.

17. A display comprising:
   a display module;
   an electromagnetic wave shield film which includes at least: an anti-reflection film on said display module; a near infrared ray absorbing film on said anti-reflection film; a first transparent base on said near infrared ray absorbing film; a second transparent base on said first transparent base, a conductor on said second transparent base and having a mesh geometric pattern, and an earth portion provided around said conductor and having conductive regions and non-conductive regions; and
   a protective film on said electromagnetic wave shield film.

18. The display of claim 16, wherein said electromagnetic wave shield unit is attached to said display module using a bracket.

19. The display of claim 16, wherein said display module is a plasma display module, a cathode ray tube display module, a liquid crystal display module or an electro luminescence display module.

* * * * *

UNITED STATES PATENT AND TRADEMARK OFFICE
CERTIFICATE OF CORRECTION

PATENT NO. : 6,884,936 B2
DATED : April 26, 2005
INVENTOR(S) : H. Takahashi et al.

It is certified that error appears in the above-identified patent and that said Letters Patent is hereby corrected as shown below:

Column 17,
Line 51, "shied" should be -- shield --.

Signed and Sealed this

Thirteenth Day of December, 2005

JON W. DUDAS
*Director of the United States Patent and Trademark Office*